United States Patent
Yokoyama et al.

(10) Patent No.: US 11,495,468 B2
(45) Date of Patent: Nov. 8, 2022

(54) ETCHING METHOD AND ETCHING APPARATUS

(71) Applicant: TOKYO ELECTRON LIMITED, Tokyo (JP)

(72) Inventors: Takahiro Yokoyama, Miyagi (JP); Maju Tomura, Miyagi (JP); Yoshihide Kihara, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/006,500

(22) Filed: Aug. 28, 2020

(65) Prior Publication Data
US 2021/0066089 A1 Mar. 4, 2021

(30) Foreign Application Priority Data
Aug. 28, 2019 (JP) .............................. JP2019-155925

(51) Int. Cl.
*H01L 21/311* (2006.01)
*H01J 37/32* (2006.01)
*H01L 21/3065* (2006.01)

(52) U.S. Cl.
CPC .... *H01L 21/31116* (2013.01); *H01J 37/3244* (2013.01); *H01J 37/32082* (2013.01); *H01L 21/3065* (2013.01); *H01L 21/31144* (2013.01); *H01J 2237/334* (2013.01)

(58) Field of Classification Search
CPC ........... H01J 2237/334; H01J 37/32082; H01J 37/3244; H01L 21/3065; H01L 21/31116; H01L 21/31144; H01L 21/67069; H01L 21/02164

USPC ........ 438/706, 710.712, 714, 717, 719, 736, 438/757, 758
See application file for complete search history.

(56) References Cited

U.S. PATENT DOCUMENTS

| | | | | |
|---|---|---|---|---|
| 9,847,231 B2* | 12/2017 | Wada | ................ | H01L 21/67069 |
| 2006/0191555 A1* | 8/2006 | Yoshida | ................ | B08B 7/0035 |
| | | | | 134/1.1 |
| 2013/0344701 A1* | 12/2013 | Liu | ................... | H01L 29/40117 |
| | | | | 438/715 |
| 2016/0056050 A1* | 2/2016 | Kong | ................ | H01L 21/32137 |
| | | | | 438/723 |
| 2018/0204728 A1* | 7/2018 | Oomori | ................... | H01L 21/31 |

FOREIGN PATENT DOCUMENTS

JP 2016-207840 A 12/2016

* cited by examiner

*Primary Examiner* — Lan Vinh
(74) *Attorney, Agent, or Firm* — Weihrouch IP

(57) ABSTRACT

An etching method includes: preparing a compound in a processing space in which an etching target is accommodated; and etching the etching target with a mask film formed thereon, under an environment where the compound exists. The etching of the etching target includes etching the etching target under an environment where hydrogen (H) and fluorine (F) exist when the etching target contains silicon nitride (SiN), and etching the etching target under an environment where nitrogen (N), hydrogen (H), and fluorine (F) exist when the etching target contains silicon (Si). The compound includes at least one halogen element selected from a group consisting of carbon (C), chlorine (Cl), bromine (Br), and iodine (I).

16 Claims, 8 Drawing Sheets

| | EXAMPLE 1 | EXAMPLE 2 |
|---|---|---|
| | CHCl3 (+20sccm) | CHCl3 (+30sccm) |
| | 103 | 104 |
| | [image] | [image] |
| | 106 | 107 |
| E/R (nm/min) | 1559 | 1350 |
| MASK SELECTIVITY | 68.8 | ∞ |
| Bottom CD (nm) | 75 | 95 |

FIG. 10

| | COMPARATIVE EXAMPLE 2 | COMPARATIVE EXAMPLE 3 | EXAMPLE 1 |
|---|---|---|---|
| | CF4/H2 | Cl2 (+20sccm) | CHCl3 (+20sccm) |
| | 101 / 104 | 102 / 105 | 103 / 106 |
| E/R (nm/min) | 1753 | 1240 | 1559 |
| MASK SELECTIVITY | 19.1 | 11.3 | 68.8 |
| Bottom CD (nm) | 0 | 106 | 75 |

| | EXAMPLE 1 | EXAMPLE 2 |
|---|---|---|
| | CHCl3 (+20sccm) | CHCl3 (+30sccm) |
| |  103, 106 |  104, 107 |
| E/R (nm/min) | 1559 | 1350 |
| MASK SELECTIVITY | 68.8 | ∞ |
| Bottom CD (nm) | 75 | 95 |

ETCHING METHOD AND ETCHING APPARATUS

CROSS-REFERENCE TO RELATED APPLICATIONS

This application is based on and claims priority from Japanese Patent Application No. 2019-155925, filed on Aug. 28, 2019, with the Japan Patent Office, the disclosure of which is incorporated herein in its entirety by reference.

TECHNICAL FIELD

The present disclosure relates to an etching method and an etching apparatus.

BACKGROUND

An etching method is known which etches a semiconductor wafer on which a silicon oxide film and a silicon nitride film are stacked, under a low-temperature environment to form a hole with a high aspect ratio (see, e.g., Japanese Patent Laid-Open Publication No. 2016-207840).

SUMMARY

According to an aspect of the present disclosure, an etching method includes preparing a compound, and etching an etching target with a mask film formed thereon, under an environment where the compound exists. The etching the etching target includes etching the etching target under an environment where hydrogen (H) and fluorine (F) exist when the etching target contains silicon nitride (SiN), and etching the etching target under an environment where nitrogen (N), hydrogen (H), and fluorine (F) exist when the etching target contains silicon (Si). The compound includes at least one halogen element selected from a group consisting of carbon (C), chlorine (Cl), bromine (Br), and iodine (I).

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 10 is a view illustrating a result of a comparison of wafers etched using etching methods of Comparative Examples 2 and 3 and Example 1.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of an etching method and an etching apparatus of the present disclosure will be described in detail with reference to the drawings.

A reaction product generated when an etching target containing silicon nitride (SiN) is etched may be a factor that disrupts the etching, and may deteriorate the shape of an etching hole. In this regard, it has been reviewed to perform the etching under an environment where chlorine gas ($Cl_2$) exists, thereby decomposing the reaction product. However, there is a problem in that the etching rate of a mask film formed on the etching target increases, and the mask selectivity decreases, under the environment where chlorine gas exists. Thus, it is expected to improve the shape of the etching hole, and furthermore, improve the mask selectivity.

[Entire Configuration of Etching Apparatus 10]

Figure 1:
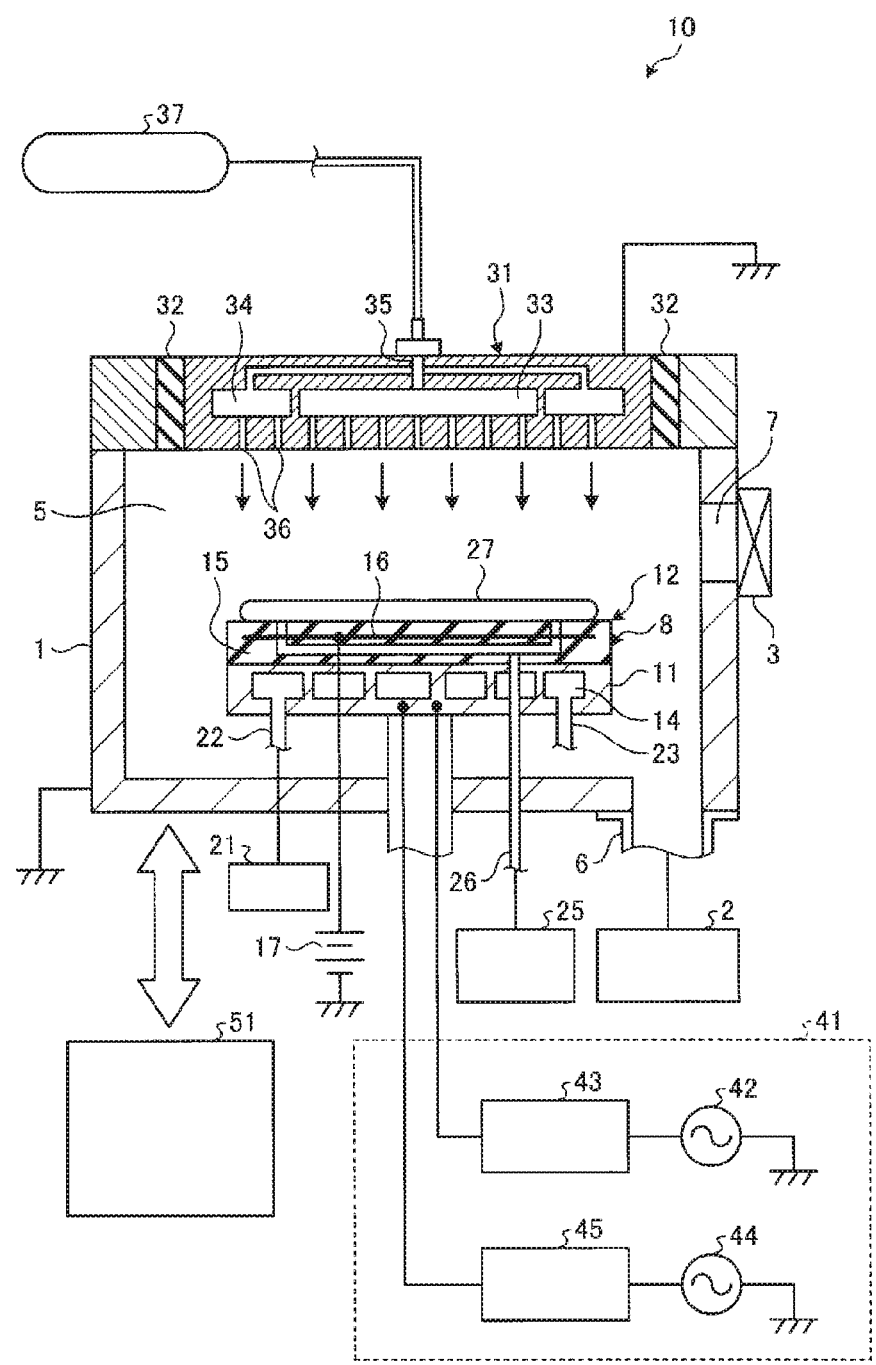
FIG. 1 is a vertical cross-sectional view illustrating an example of an etching apparatus.

FIG. 1 is a vertical cross-sectional view illustrating an example of an etching apparatus 10. The etching apparatus 10 is a capacitively coupled plasma processing apparatus, and includes a chamber 1, an exhaust device 2, and a gate valve 3. The chamber 1 is formed of aluminum in a cylindrical shape, and has an alumite-processed (anodized) surface. The chamber 1 is electrically grounded. A processing space 5 is formed in the chamber 1. The chamber 1 isolates the processing space 5 from the outside atmosphere. Further, an exhaust port 6 and an opening 7 are formed in the chamber 1. The exhaust port 6 is formed in the bottom surface of the chamber 1. The opening 7 is formed in the sidewall of the chamber 1. The exhaust device 2 is connected to the processing space 5 of the chamber 1 through the exhaust port 6. The exhaust device 2 exhausts a gas from the processing space 5 through the exhaust port 6. The gate valve 3 opens or closes the opening 7.

The etching apparatus 10 further includes a stage 8. The stage 8 is disposed in the processing space 5, and provided at the bottom of the chamber 1. The stage 8 includes a support 11 and an electrostatic chuck 12. The support 11 is formed of a conductor such as aluminum (Al), titanium (Ti) or silicon carbide (SiC). The support 11 is supported in the chamber 1. A coolant flow path 14 is formed inside the support 11. The electrostatic chuck 12 is disposed on the support 11 and supported by the support 11. The electrostatic chuck 12 includes an electrostatic chuck body 15 and a chuck electrode 16. The electrostatic chuck body 15 is formed of an insulator. The electrostatic chuck 12 is formed such that the chuck electrode 16 is embedded in the electrostatic chuck body 15. The etching apparatus 10 further includes a DC voltage source 17. The DC voltage source 17 is electrically connected to the chuck electrode 16, and supplies a DC current to the chuck electrode 16.

The etching apparatus 10 further includes a chiller 21, a coolant inlet pipe 22, and a coolant outlet pipe 23. The chiller 21 is connected to the coolant flow path 14 via the coolant inlet pipe 22 and the coolant outlet pipe 23. The chiller 21 cools a cooling medium such as cooling water or brine, and circulates the cooled cooling medium in the coolant flow path 14 through the coolant inlet pipe 22 and the coolant outlet pipe 23, so as to cool the electrostatic chuck 12 of the stage 8.

The etching apparatus 10 further includes a heat transfer gas source 25 and a heat transfer gas supply line 26. The heat transfer gas supply line 26 is provided such that one end thereof reaches the upper surface of the electrostatic chuck 12. The heat transfer gas source 25 supplies a heat transfer gas such as helium gas (He) or argon gas (Ar) to the heat transfer gas supply line 26, so as to supply the heat transfer gas between the wafer 27 placed on the stage 8 and the electrostatic chuck 12.

The etching apparatus 10 further includes a gas shower head 31 and a shield ring 32. The gas shower head 31 is formed of a conductor in a disc shape. The gas shower head 31 is disposed to face the stage 8, and disposed such that the plane along the lower surface of the gas shower head 31 is substantially parallel to the plane along the upper surface of the stage 8. The gas shower head 31 is disposed to close the opening formed in the ceiling of the chamber 1. The shield ring 32 is formed of an insulator in a ring shape. The shield ring 32 covers the peripheral portion of the gas shower head 31. The gas shower head 31 is supported by the chamber 1 via the shield ring 32 such that the gas shower head 31 and the chamber 1 are insulated from each other. The gas shower head 31 is electrically grounded. A variable DC power supply may be connected to the gas shower head 31 to apply a predetermined DC voltage.

In the gas shower head 31, a center-side diffusion chamber 33, an edge-side diffusion chamber 34, a gas inlet port 35, and a plurality of gas supply holes 36 are formed. The center-side diffusion chamber 33 is provided at the center of the gas shower head 31 inside the gas shower head 31. The edge-side diffusion chamber 34 is provided close to the edge of the gas shower head 31 inside the gas shower head 31, and provided between the edge of the gas shower head 31 and the center-side diffusion chamber 33. The gas inlet port 35 is formed above the center-side diffusion chamber 33 and the edge-side diffusion chamber 34 inside the gas shower head 31, and communicates with each of the center-side diffusion chamber 33 and the edge-side diffusion chamber 34. The plurality of gas supply holes 36 are formed below the center-side diffusion chamber 33 and the edge-side diffusion chamber 34 inside the gas shower head 31, communicate with the center-side diffusion chamber 33 and the edge-side diffusion chamber 34, and communicate with the processing space 5.

The etching apparatus 10 further includes a processing gas source 37. The processing gas source 37 is connected to the gas inlet port 35. The processing gas source 37 supplies a predetermined processing gas to the gas inlet port 35. The processing gas contains a mixed gas in which carbon tetrafluoride ($CF_4$) and hydrogen ($H_2$) are mixed. A predetermined compound is added to the processing gas. Examples of the compound include chlorine gas $Cl_2$, silicon tetrachloride ($SiCl_4$), hydrogen bromide (HBr), and hydrogen iodide (HI). The carbon tetrafluoride ($CF_4$) may be replaced with sulfur hexafluoride ($SF_6$) or sulfur tetrafluoride ($SF_4$).

The support 11 of the stage 8 is used as a lower electrode, and the gas shower head 31 is used as an upper electrode. The etching apparatus 10 further includes a power supply device 41. The power supply device 41 includes a first radio frequency power supply 42, a first matching unit 43, a second radio frequency power supply 44, and a second matching unit 45. The first radio frequency power supply 42 is connected to the stage 8 via the first matching unit 43. The first radio frequency power supply 42 supplies a first radio frequency of a first frequency (e.g., 40 MHz) to the support 11 of the stage 8 with a predetermined power. The first matching unit 43 matches a load impedance to the internal (or output) impedance of the first radio frequency power supply 42. The first matching unit 43 functions such that the internal impedance of the first radio frequency power supply 42 and the load impedance externally match each other when plasma is generated in the processing space 5.

The second radio frequency power supply 44 is connected to the stage 8 via the second matching unit 45. The second radio frequency power supply 44 supplies a second radio frequency of a second frequency (e.g., 0.3 MHz) lower than the first frequency to the stage 8 with a predetermined power. The second matching unit 45 matches the load impedance to the internal (or output) impedance of the second radio frequency power supply 44. The second matching unit 45 functions such that the internal impedance of the second radio frequency power supply 44 and the load impedance externally match each other when plasma is generated in the processing space 5. In the present embodiment, the first and second radio frequencies are applied to the stage 8. However, the first and second radio frequencies may be applied to the gas shower head 31.

Figure 2:
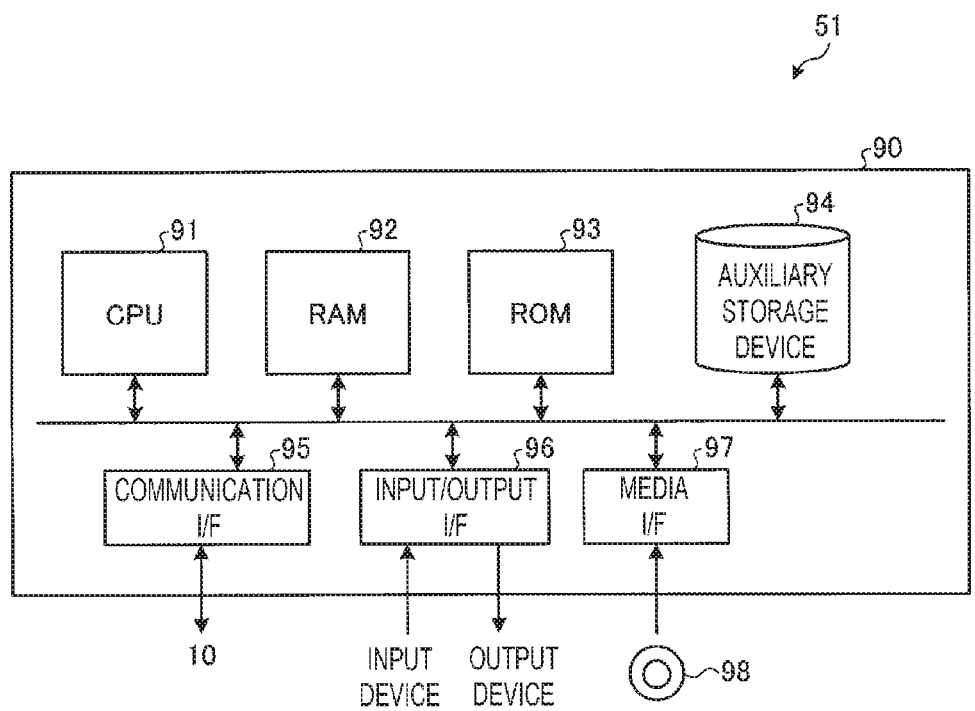
FIG. 2 is a view illustrating an example of a control device.

The etching apparatus 10 further includes a control device 51. FIG. 2 is a view illustrating an example of the control device 51. The control device 51 is implemented by a computer 90. The computer 90 includes a central processing unit (CPU) 91, a random access memory (RAM) 92, and a read only memory (ROM) 93. The CPU 91 operates based on programs installed in the computer 90, and controls each component of the computer 90 so as to control the etching apparatus 10. The ROM 93 stores a boot program executed by the CPU 91 when the computer 90 is started or a program that relies on the hardware of the computer 90.

The computer 90 further includes an auxiliary storage device 94, a communication interface 95, an input/output interface 96, and a media interface 97. The auxiliary storage device 94 records a program executed by the CPU 91 and data used by the program. Examples of the auxiliary storage device 94 include a hard disk drive (HDD) and a solid state drive (SSD). The CPU 91 reads out the program from the auxiliary storage device 94, loads the read program to the RAM 92, and executes the loaded program.

The communication interface 95 communicates with the etching apparatus 10 via a communication line such as a local area network (LAN). The communication interface 95 sends information received from the etching apparatus 10 via the communication line to the CPU 91, and sends data generated by the CPU 91 to the etching apparatus 10 via the communication line.

The computer 90 further includes an input device such as a keyboard and an output device such as a display. The CPU 91 controls the input device and the output device via the input/output interface 96. The input/output interface 96 transmits a signal input via the input device to the CPU 91, and outputs data generated by the CPU 91 to the output device.

The media interface 97 reads a program or data recorded on a non-transitory tangible recording medium 98. Examples of the recording medium 98 include an optical recording medium, a magneto-optical recording medium, a tape medium, a magnetic recording medium, and a semiconductor memory. Examples of the optical recording medium include a digital versatile disk (DVD) and a phase change rewritable disk (PD). Examples of the magneto-optical recording medium include a magneto-optical disk (MO).

The CPU 91 executes the program read from the recording medium 98 via the media interface 97, but in another example, the CPU 91 may execute a program acquired from another device via the communication interface 95.

[Etching Method]

The etching method is performed using the etching apparatus 10. In the etching method, first, the control device 51 controls the gate valve 3 to open the opening 7. When the opening 7 is opened, the wafer 27 to be processed is carried into the processing space 5 of the chamber 1 through the opening 7, and placed on the stage 8. After the wafer 27 is placed on the stage 8, the control device 51 controls the DC voltage source 17 to apply a DC voltage to the chuck electrode 16. When the DC voltage is applied to the chuck electrode 16, the wafer 27 is held on the electrostatic chuck 12 by the Coulomb force. The control device 51 controls the gate valve 3 to close the opening 7. When the opening 7 is closed, the control device 51 controls the exhaust device 2 to exhaust the gas from the processing space 5 such that the atmosphere of the processing space 5 reaches a predetermined degree of vacuum.

While the wafer 27 is held on the electrostatic chuck 12, the control device 51 controls the heat transfer gas source 25 to supply the heat transfer gas to the heat transfer gas supply line 26, thereby supplying the heat transfer gas between the electrostatic chuck 12 and the wafer 27. The control device 51 controls the chiller 21 to circulate a coolant cooled to a predetermined temperature in the coolant flow path 14 and cool the electrostatic chuck 12. At this time, heat is transferred from the electrostatic chuck 12 to the wafer 27 via the heat transfer gas supplied between the electrostatic chuck 12 and the wafer 27, so that the temperature of the wafer 27 is adjusted to fall within a predetermined temperature range.

When the temperature of the wafer 27 is adjusted to a predetermined temperature, the control device 51 controls the processing gas source 37 to supply a processing gas having a predetermined composition to the gas inlet port 46. After the processing gas is supplied to the gas inlet port 46, the processing gas is supplied to the center-side diffusion chamber 33 and the edge-side diffusion chamber 34, such that the processing gas is diffused in the center-side diffusion chamber 33 and the edge-side diffusion chamber 34. After the processing gas is diffused in the center-side diffusion chamber 33 and the edge-side diffusion chamber 34, the processing gas is supplied in a shower form into the processing space 5 of the chamber 1 through the plurality of gas supply holes 36, to fill the processing space 5.

The control device 51 controls the first radio frequency power supply 42 and the second radio frequency power supply 44, to supply the first radio frequency for a plasma excitation and the second radio frequency for a biasing to the stage 8. When the first radio frequency is supplied to the stage 8, plasma is generated in the processing space 5, and radicals, ions, light, and electrons are generated. When the second radio frequency is supplied to the stage 8, the ions in the plasma are accelerated toward the wafer 27. The wafer 27 is etched by the radicals or ions included in the plasma generated in the processing space 5.

After the wafer 27 is etched, the control device 51 controls the first radio frequency power supply 42 and the second radio frequency power supply 44, to stop the supply of the radio frequency power to the processing space 5. The control device 51 controls the DC voltage source 17 to apply a DC voltage having positive and negative polarities which are reverse to those when the wafer 27 is adsorbed, to the chuck electrode 16. When the reversed DC voltage is applied to the chuck electrode 16, the wafer 27 is destaticized and separated from the electrostatic chuck 12. The control device 51 controls the gate valve 3 to open the opening 7. When the wafer 27 is not held on the electrostatic chuck 12, and when the opening 7 is opened, the wafer 27 is carried out from the processing space 5 of the chamber 1 through the opening 7.

It is known that when an etching target containing silicon nitride (SiN) is etched with plasma using a fluorocarbon-based gas, a modified layer is formed on the surface of the etching target. Further, it is known that the modified layer is decomposed or sublimated when the etching target is heated to about 200° C.

In the etching method described above, the wafer 27 is etched under an atmosphere where hydrogen (H) and fluorine (F) exist. In the etching method described above, it is presumed that when the wafer 27 contains silicon dioxide ($SiO_2$), chemical reactions expressed by the following chemical reaction formulae occur.

$$Si(OH)_4 + HF \rightarrow SiF(OH)_3 + H_2O - 0.40 \text{ eV}$$

$$SiF(OH)_3 + HF \rightarrow SiF_2(OH)_2 + H_2O - 0.78 \text{ eV}$$

$$SiF_2(OH)_2 + HF \rightarrow SiF_3(OH) + H_2O - 1.11 \text{ eV}$$

$$SiF_3(OH) + HF \rightarrow SiF_4 + H_2O - 1.38 \text{ eV}$$

According to the chemical reactions, silicon tetrafluoride ($SiF_4$) is produced when the wafer 27 is etched under the atmosphere where hydrogen (H) and fluorine (F) exist. Silicon tetrafluoride ($SiF_4$) has a relatively high volatility. Thus, when the wafer 27 is formed of only silicon dioxide ($SiO_2$), and when the wafer 27 is etched with hydrogen fluoride (HF), silicon tetrafluoride ($SiF_4$) is hardly attached to the surface of the wafer 27.

In the etching method described above, it is presumed that when the wafer 27 contains silicon nitride (SiN), chemical reactions expressed by the following chemical reaction formulae occur.

$$Si(NH_2)_4 + HF \rightarrow SiF(NH_2)_3 + NH_3 - 1.08 \text{ eV}$$

$$SiF(NH_2)_3 + HF \rightarrow SiF_2(NH_2)_2 + NH_3 - 2.03 \text{ eV}$$

$$SiF_2(NH_2)_2 + HF \rightarrow SiF_3(NH_2) + NH_3 - 2.77 \text{ eV}$$

$$SiF_3(NH_2) + HF \rightarrow SiF_4 + NH_3 - 3.04 \text{ eV}$$

$$SiF_4 + HF + NH_3 \rightarrow (NH_4)SiF_5 - 3.90 \text{ eV}$$

$$(NH_4)SiF_5 + HF + NH_3 \rightarrow (NH_4)_2SiF_6 - 4.80 \text{ eV}$$

In the chemical reactions as well, silicon tetrafluoride (SiF$_4$) is produced as in the case where silicon dioxide (SiO$_2$) is etched under the atmosphere where hydrogen (H) and fluorine (F) exist. According to the chemical reactions, ammonia (NH$_3$) is also produced when the wafer 27 is etched under the atmosphere where hydrogen (H) and fluorine (F) exist. According to the chemical reaction, it is presumed that ammonium fluorosilicate salt ((NH$_4$)$_2$SiF$_6$) (hereinafter, referred to as "salt AFS") derived from silicon tetrafluoride (SiF$_4$) and ammonia (NH$_3$) is produced.

Figure 3:
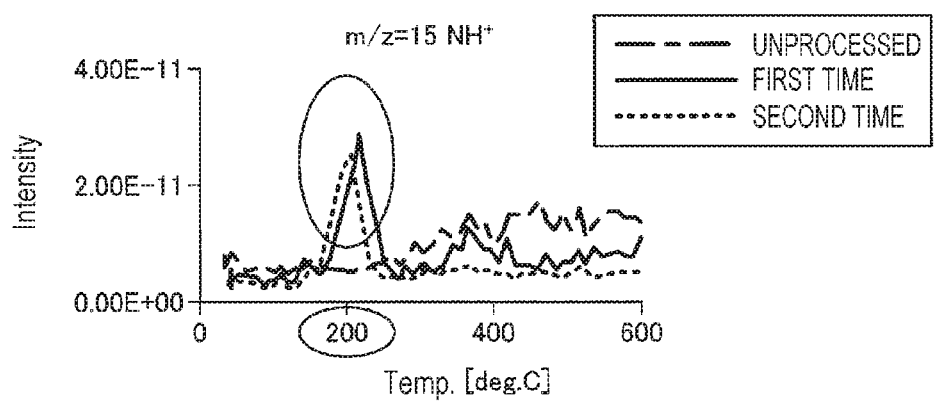
FIG. 3 is a graph representing a result of a thermal desorption spectroscopy (TDS) analysis of a by-product attached to the surface of a wafer etched using an etching method of Comparative Example 1 for a gas having a mass number m/z of 15.

FIG. 3 is a graph representing a result of a thermal desorption spectroscopy (TDS) analysis of a by-product attached to the surface of the wafer 27 etched using the etching method of Comparative Example 1, for a gas having a mass number m/z of 15. In the etching method of Comparative Example 1, the wafer 27 contains silicon nitride (SiN), and is etched under the following processing conditions. The TDS analysis is conducted a total of three times for one unprocessed wafer and two processed wafers.

Pressure of processing space 5: 80 mTorr
Frequency of first radio frequency: 100 MHz
Power of first radio frequency: 2,500 W (effective)
Frequency of second radio frequency: 400 kHz
Power of second radio frequency: 1,000 W
Composition of processing gas: SF$_6$/H$_2$
Wafer temperature: −60° C.

The graph of FIG. 3 represents that when the wafer 27 etched using the etching method of Comparative Example 1 is heated to about 200° C., a gas having a mass number m/z of 15 is generated from the surface of the wafer 27. It is presumed that the gas having the mass number m/z of 15 is NH$^+$. Thus, the graph of FIG. 3 represents the presumption that the by-product attached to the surface of the wafer 27 according to the etching method of Comparative Example 1 is a compound containing NH$^+$.

Figure 4:
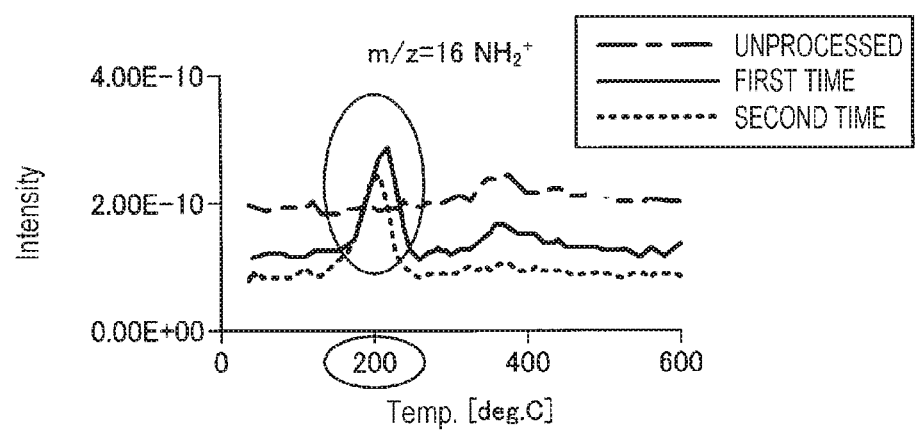
FIG. 4 is a graph representing a result of the TDS analysis of the by-product attached to the surface of the wafer etched using the etching method of Comparative Example 1 for a gas having a mass number m/z of 16.

FIG. 4 is a graph representing a result of the TDS analysis of the by-product attached to the surface of the wafer 27 etched using the etching method of Comparative Example 1, for a gas having a mass number m/z of 16. The graph of FIG. 4 represents that when the wafer 27 etched using the etching method of Comparative Example 1 is heated to about 200° C., a gas having a mass number m/z of 16 is generated from the surface of the wafer 27. It is presumed that the gas having the mass number m/z of 16 is NH$_2^+$. Thus, the graph of FIG. 4 represents the presumption that the by-product attached to the surface of the wafer 27 according to the etching method of Comparative Example 1 is a compound containing NH$_2^+$.

Figure 5:
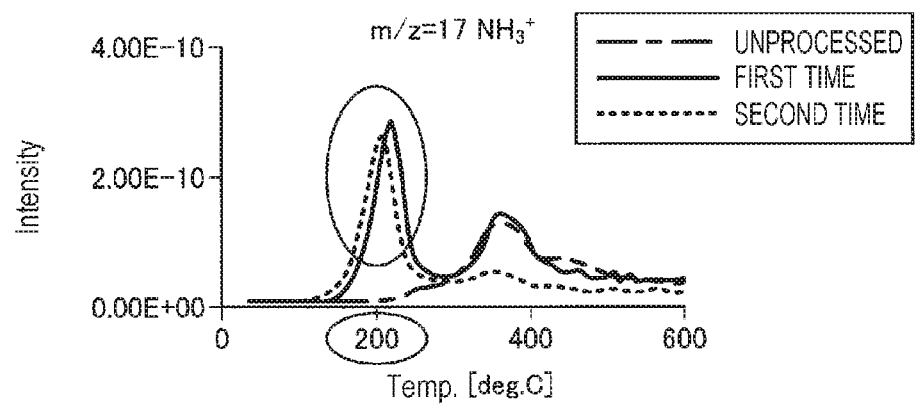
FIG. 5 is a graph representing a result of the TDS analysis of the by-product attached to the surface of the wafer etched using the etching method of Comparative Example 1 for a gas having a mass number m/z of 17.

FIG. 5 is a graph representing a result of the TDS analysis of the by-product attached to the surface of the wafer 27 etched using the etching method of Comparative Example 1, for a gas having a mass number m/z of 17. The graph of FIG. 5 represents that when the wafer 27 etched using the etching method of Comparative Example 1 is heated to about 200° C., a gas having a mass number m/z of 17 is generated from the surface of the wafer 27. It is presumed that the gas having the mass number m/z of 17 may be NH$_3^+$. Thus, the graph of FIG. 5 represents the presumption that the by-product attached to the surface of the wafer 27 according to the etching method of Comparative Example 1 is a compound containing NH$_3^+$. Further, since the peak around 400° C. is also observed for the unprocessed wafer, it is presumed that the peak results from the substrate.

Figure 6:
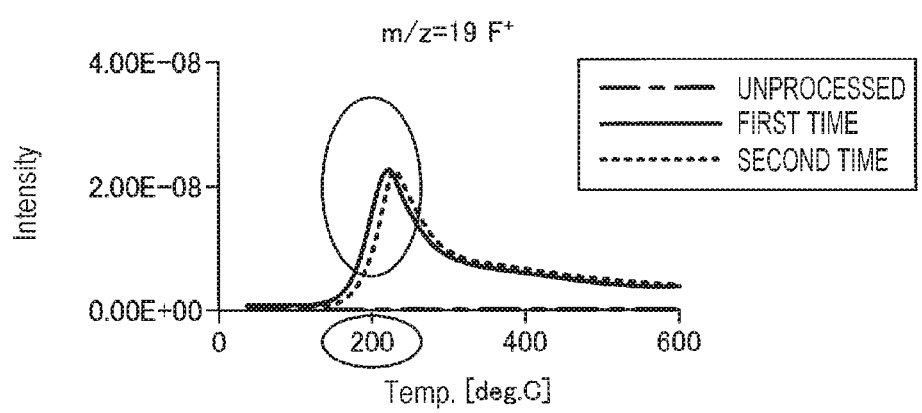
FIG. 6 is a graph representing a result of the TDS analysis of the by-product attached to the surface of the wafer etched using the etching method of Comparative Example 1 for a gas having a mass number m/z of 19.

FIG. 6 is a graph representing a result of the TDS analysis of the by-product attached to the surface of the wafer etched using the etching method of Comparative Example 1, for a gas having a mass number m/z of 19. The graph of FIG. 6 represents that when the wafer 27 etched using the etching method of Comparative Example 1 is heated to about 200° C., a gas having a mass number m/z of 19 is generated from the surface of the wafer 27. It is assumed that the gas having the mass number m/z of 19 is F$^+$. Thus, the graph of FIG. 6 represents the presumption that the by-product attached to the surface of the wafer 27 according to the etching method of Comparative Example 1 is a compound containing F$^+$.

Figure 7:
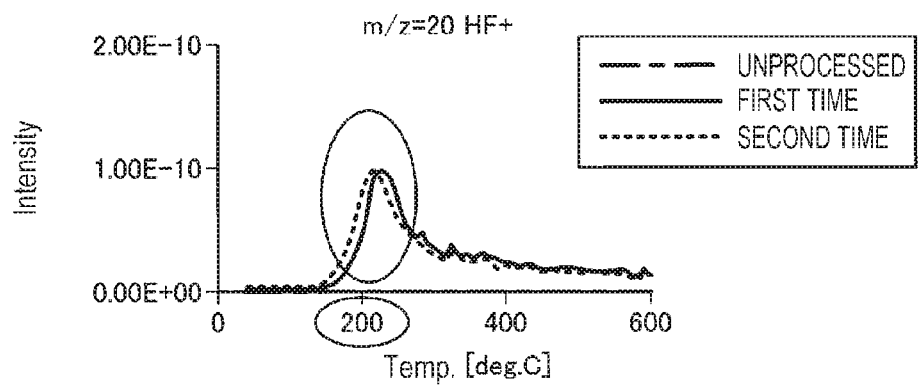
FIG. 7 is a graph representing a result of the TDS analysis of the by-product attached to the surface of the wafer etched using the etching method of Comparative Example 1 for a gas having a mass number m/z of 20.

FIG. 7 is a graph representing a result of the TDS analysis of the by-product attached to the surface of the wafer etched using the etching method of Comparative Example 1, for a gas having a mass number m/z of 20. The graph of FIG. 7 represents that when the wafer 27 etched using the etching method of Comparative Example 1 is heated to about 200° C., a gas having a mass number m/z of 20 is generated from the surface of the wafer 27. It is presumed that the gas having the mass number m/z of 20 is HF$^+$. Thus, the graph of FIG. 7 represents the presumption that the by-product attached to the surface of the wafer 27 according to the etching method of Comparative Example 1 is a compound containing HF$^+$.

Figure 8:
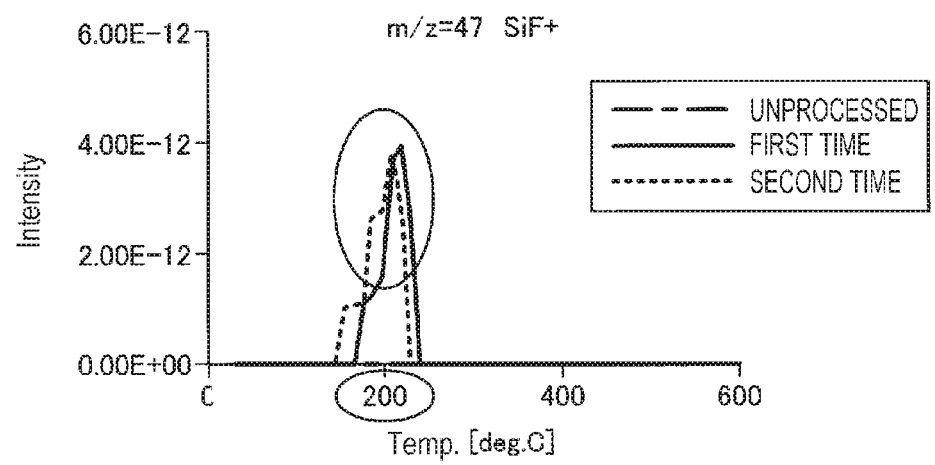
FIG. 8 is a graph representing a result of the TDS analysis of the by-product attached to the surface of the wafer etched using the etching method of Comparative Example 1 for a gas having a mass number m/z of 47.

FIG. 8 is a graph representing a result of the TDS analysis of the by-product attached to the surface of the wafer etched using the etching method of Comparative Example 1, for a gas having a mass number m/z of 47. The graph of FIG. 8 represents that when the wafer 27 etched using the etching method of Comparative Example 1 is heated to about 200° C., a gas having a mass number m/z of 47 is generated from the surface of the wafer 27. It is presumed that the gas having the mass number m/z of 47 is SiF$^+$. Thus, the graph of FIG. 8 represents the presumption that the by-product attached to the surface of the wafer 27 according to the etching method of Comparative Example 1 is a compound containing SiF$^+$.

Figure 9:
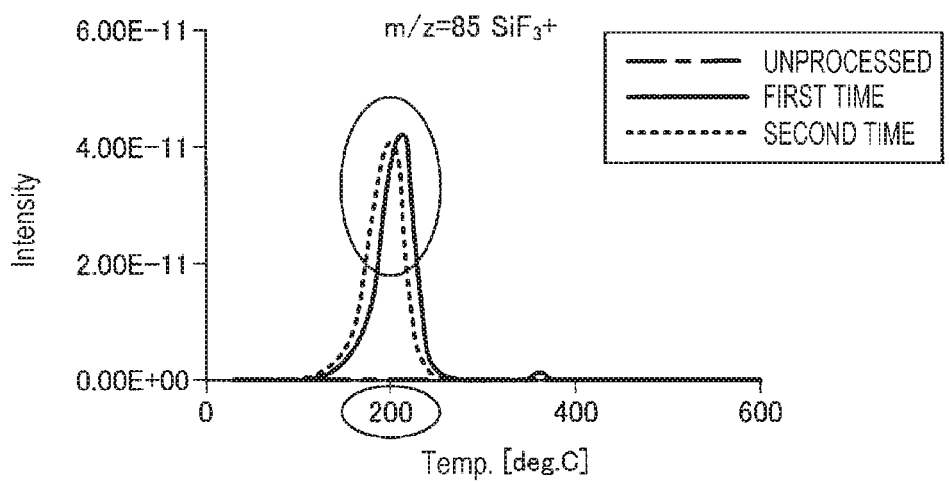
FIG. 9 is a graph representing a result of the TDS analysis of the by-product attached to the surface of the wafer etched using the etching method of Comparative Example 1 for a gas having a mass number m/z of 85.

FIG. 9 is a graph representing a result of the TDS analysis of the by-product attached to the surface of the wafer etched using the etching method of Comparative Example 1, for a gas having a mass number m/z of 85. The graph of FIG. 9 represents that when the wafer 27 etched using the etching method of Comparative Example 1 is heated to about 200° C., a gas having a mass number m/z of 85 is generated from the surface of the wafer 27. It is presumed that the gas having the mass number m/z of 85 is SiF$_3^+$. Thus, the graph of FIG. 9 represents the presumption that the by-product attached to the surface of the wafer 27 according to the etching method of Comparative Example 1 is a compound containing SiF$_3^+$.

FIGS. 3 to 9 represent the presumption that the by-products attached to the surface of the wafer 27 according to the etching method of Comparative Example 1 are the compounds containing NH$^+$, NH$_2^+$, NH$_3^+$, F$^+$, HF$^+$, SiF$^+$, and SiF$_3^+$, respectively. That is, FIGS. 3 to 9 represent that the by-product produced by the etching method of Comparative Example 1 is the salt AFS.

FIG. 10 is a view illustrating a result of a comparison of wafers 101 to 103 etched using etching methods of Comparative Examples 2 and 3 and Example 1. The wafer 101 etched using the etching method of Comparative Example 2 includes a silicon substrate, a silicon nitride film, and a mask film. The silicon nitride film is formed of silicon nitride (SiN). The silicon nitride film is formed on one surface of the silicon substrate. The mask film is, for example, an organic film in which openings are formed in a predetermined pattern. The mask film is formed on the silicon nitride film, such that the silicon nitride film is sandwiched between the silicon substrate and the mask film. In the etching method of Comparative Example 2, the wafer 101 is etched under the following processing conditions.

Pressure of processing space 5: 25 mTorr
Frequency of first radio frequency: 40 MHz
Power of first radio frequency: 4.5 kW
Frequency of second radio frequency: 0.4 MHz
Power of second radio frequency: 7 kW
Composition of processing gas: $CF/H_2$
Wafer temperature: −60° C.

The wafer 102 etched using the etching method of Comparative Example 3 is the same as the wafer 101. In the etching method of Comparative Example 3, the wafer 102 is etched under the following processing conditions. That is, in the etching method of Comparative Example 3, chlorine gas ($Cl_2$) is added to the processing gas, and the other conditions are the same as those in the etching method of Comparative Example 2.

Pressure of processing space 5: 25 mTorr
Frequency of first radio frequency: 40 MHz
Power of first radio frequency: 4.5 kW
Frequency of second radio frequency: 0.4 MHz
Power of second radio frequency: 7 kW
Composition of processing gas: $CF/H_2/Cl_2$ (+20 sccm)
Wafer temperature: −60° C.

The wafer 103 etched using the etching method of Example 1 is the same as the wafer 101. In the etching method of Example 1, the wafer 103 is etched under the following processing conditions. That is, in the etching method of Example 1, chloroform ($CHCl_3$) is added to the processing gas, and the other conditions are the same as those in the etching method of Comparative Example 2.

Pressure of processing space 5: 25 mTorr
Frequency of first radio frequency: 40 MHz
Power of first radio frequency: 4.5 kW
Frequency of second radio frequency: 0.4 MHz
Power of second radio frequency: 7 kW
Composition of processing gas: $CF_4/H_2/CHCl_3$ (+20 sccm)
Wafer temperature: −60° C.

FIG. 10 represents the cross-sections of the wafers 101, 102, and 103 from the left side. FIG. 10 further represents an etching rate (F/R), a mask selectivity, and a dimension of the bottom surface of an etching hole (bottom CD) for each of the wafers 101 to 103. The comparison result of FIG. 10 represents that the dimension of the bottom surface of an etching hole 105 formed in the wafer 102 is larger than the dimension of the bottom surface of an etching hole 104 formed in the wafer 101. Further, FIG. 10 represents that the dimension of the bottom surface of an etching hole 106 formed in the wafer 103 is larger than the dimension of the bottom surface of the etching hole 104 formed in the wafer 101. FIG. 10 represents that unless the dimension of an opening of an etching hole changes, the shape of the cross-section of the etching hole is close to the rectangular shape as the dimension of the bottom surface of the etching hole increases, and is close to a tapered shape as the dimension of the bottom surface of the etching hole decreases. That is, the comparison result of FIG. 10 represents that the etching methods of Comparative Example 3 and Example 1 may form an etching hole having the bottom surface with the larger dimension than that in the etching method of Comparative Example 2, and thus, may improve the shape of the etching hole. Accordingly, the comparison result of FIG. 10 represents that the etching methods of Comparative Example 3 and Example 1 may reduce the amount of the etching by-product that contains the salt AFS and is attached to the wafer, as compared to the etching method of Comparative Example 1.

It is presumed that when chlorine gas ($Cl_2$) is introduced, a chemical reaction expressed by the following chemical reaction formula occurs, and the salt AFS is decomposed or sublimated.

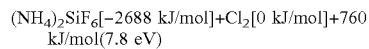

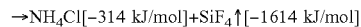

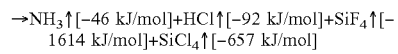

That is, it is presumed that the etching method of Comparative Example 3 described above may reduce the amount of the by-product attached to the surface of the wafer, by decomposing the salt AFS produced by the etching using chlorine gas ($Cl_2$). Accordingly, it is presumed that the etching method of Example 1 described above may reduce the amount of the by-product attached to the surface of the wafer, by decomposing the salt AFS produced by the etching using chloroform ($CHCl_3$).

Further, the comparison result of FIG. 10 represents that the mask selectivity of the wafer 102 is lower than the mask selectivity of the wafer 101. That is, the comparison result of FIG. 10 represents that the amount of the wear of the mask film in the etching method of Comparative Example 3 is higher than that in the etching method of Comparative Example 2. Meanwhile, the comparison result of FIG. 10 represents that the mask selectivity of the wafer 103 is higher than the mask selectivity of the wafer 101 and the mask selectivity of the wafer 102. That is, the comparison result of FIG. 10 represents that the etching method of Example 1 may further improve the mask selectivity, as compared with the etching methods of Comparative Examples 2 and 3. Accordingly, it is presumed that the etching method of Example 1 deposits the carbon (C) contained in chloroform ($CHCl_3$) as a deposit on the mask film so as to protect the mask film using the deposit, and as a result, may reduce the amount of the wear of the mask film.

Thus, the etching method of the present embodiment includes preparing chloroform ($CHCl_3$) and etching the wafer 27 on which the mask film is formed under an atmosphere where chloroform ($CHCl_3$) exists. Even when the wafer 27 is etched at a temperature lower than the temperature at which the salt AFS is decomposed or sublimated (e.g., 200° C.), the etching method of the present embodiment may decompose the salt AFS attached to the wafer 27, and reduce the amount of the salt AFS attached to the wafer 27. When the amount of the salt AFS attached to the wafer 27 is reduced, the etching method of the present embodiment may improve the shape of the etching hole. Further, the etching method of the present embodiment may improve the mask selectivity by depositing the carbon (C) contained in chloroform ($CHCl_3$) as a deposit on the mask film.

The composition produced as a result of the decomposition of the salt AFS needs to be volatilized and removed in order to prevent the stay of the composition. That is, it is preferable that the temperature of the wafer is higher than the temperature at which among the components produced as a result of the decomposition of the salt AFS, a silicon-containing reaction product represented by silicon halide such as $SiF_4$ or $SiCl_4$ having a relatively low vapor pressure is volatilized. Especially, it is preferable that the temperature of the surface of the wafer where the chemical reaction of the decomposition of the salt AFS occurs is relatively high.

The description that the temperature of the wafer is higher than the temperature at which the reaction product is volatilized indicates that the temperature of the wafer is higher than the temperature represented by the vapor pressure curve of the reaction product. When a plurality of species of reaction products are produced, a reaction product with a relatively higher temperature is selected.

The temperature of the wafer is adjusted in the manner that the heat from the electrostatic chuck 12 cooled by circulating a coolant cooled to a predetermined temperature is transferred to the wafer via the heat transfer gas. Here, since the wafer is exposed to the plasma generated by the first radio frequency power supply 42 for the plasma excitation, and irradiated with light from the plasma or ions accelerated by the second radio frequency power supply 44 for the biasing, the temperature of the wafer, especially, the temperature of the surface of the wafer that faces the plasma may become higher than the adjusted temperature. Thus, when the actual temperature of the wafer may be measured during the etching or when a difference between the adjusted temperature of the wafer and the actual temperature of the surface of the wafer may be estimated from the processing conditions, the setting temperature for adjusting the temperature of the wafer may be lowered in a scope that the temperature of the surface of the wafer becomes higher than the temperature represented by the vapor pressure curve of the reaction product.

In the etching method of the embodiment, the wafer 27 is disposed between the support 11 of the stage 8 and the gas shower head 31. At this time, the first radio frequency for generating plasma in the processing space 5 and the second radio frequency for the biasing, that is, for accelerating the plasma are applied to the support 11 of the stage 8 and the gas shower head 31. In this etching method, the wafer is etched with the plasma described above, so that an etching hole with a high aspect ratio may be formed in the wafer, and the wafer 27 may be appropriately etched.

In the etching method of the embodiment, the surface temperature of the wafer 27 is higher than the temperature represented by the vapor pressure curve of the reaction product containing silicon, and is equal to or lower than 100° C. In this etching method, for example, even when a device that breaks at a high temperature is provided on the wafer 27, the salt AFS attached to the wafer 27 may be removed from the wafer 27, so that wafer 27 may be appropriately etched.

In the etching method of Example 1 described above, the wafer 27 is etched when the temperature of the wafer 27 is 100° C. or lower. However, the wafer 27 may be etched when the temperature of the wafer 27 is 100° C. or higher. In this case as well, the etching method of Example 1 may remove the salt AFS attached to the wafer 27 from the wafer 27, so that the wafer 27 may be appropriately etched.

While the etching method of Example 1 etches the wafer including silicon nitride (SiN), the etching target may be a wafer including a multilayer film in which a plurality of silicon oxide films and a plurality of silicon nitride films are stacked. Further, the etching target may be a wafer containing silicon dioxide ($SiO_2$) or a wafer containing silicon nitride (SiN) and silicon dioxide ($SiO_2$). When this etching target is etched, the etching method of the embodiment may also reduce the amount of the salt AFS attached to the etching target, so that the shape of the etching hole may be improved. Further, when the etching target described above is etched, the etching method of the embodiment also deposits the carbon (C) included in chloroform ($CHCl_3$) as a deposit on the mask film, so that the mask selectivity may be improved.

In the etching method of Example 1 described above, chloroform ($CHCl_3$) is added to the processing gas. However, another compound containing carbon (C) and chlorine (Cl) or another compound containing carbon (C) and a halogen element other than chlorine (Cl) may be added. Examples of the halogen element include bromine (Br) and iodine (I). Examples of another compound include carbon halide, carbonyl halide, and halogenated benzene. Examples of carbon halide include dichloromethane ($CH_2Cl_2$), chloromethane ($CH_3Cl$), carbon tetrachloride ($CCl_4$), bromoform ($CHBr_3$), iodoform ($CHI_3$), trichlorofluoromethane ($CFCl_3$), and vinyl chloride ($C_2H_3Cl$). Examples of carbonyl halide include phosgene ($COCl_2$) and acetyl chloride ($C_2H_3ClO$). Examples of halogenated benzene include chlorobenzene ($C_6H_5Cl$) and dichlorobenzene ($C_6H_4Cl_2$).

The comparison result of FIG. 10 further represents that the etching rate of the wafer 103 is higher than the etching rate of the wafer 102. That is, the comparison result of FIG. 10 represents that the etching method of Example 1 may further improve the etching rate, as compared with the etching method of Comparative Example 3. That is, according to the etching method of Example 1, it is presumed that the covalent bond between carbon (C) and chlorine (Cl) contained in chloroform ($CHCl_3$) is released, and the by-product of carbon (C) and nitrogen (N) is eliminated from the silicon nitride film of the wafer, so that the etching rate of the wafer may be improved.

In the etching method of Example 1 described above, the flow rate of chloroform ($CHCl_3$) added to the processing gas is fixed at 20 sccm. However, the ratio of the flow rate of chloroform ($CHCl_3$) to the total flow rate of the processing gas may be changed.

Figure 11:
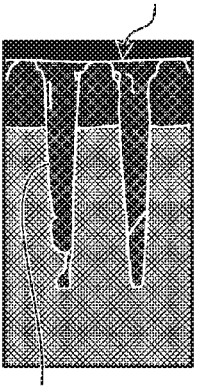
FIG. 11 is a view illustrating a result of a comparison of wafers etched using etching methods of Examples 1 and 2.
Figure 11:
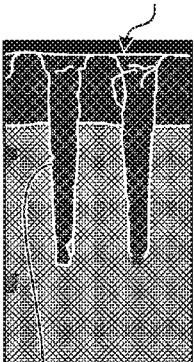

FIG. 11 is a view illustrating a result of a comparison between the wafer 103 etched using the etching method of Example 1 and a wafer 104 etched using an etching method of Example 2. In the processing conditions of the etching method of Example 2, the composition of the processing gas in the processing conditions of the etching method of Example 1 is changed into $CF_4/H_2/CHCl_3$ (+30 sccm), and the other conditions are the same as those in the etching method of Example 1.

FIG. 11 represents the cross-section of the wafer 103 etched using the etching method of Example 1 and the cross-section of the wafer 104 etched using the etching method of Example 2. Further, FIG. 11 represents the etching rate (E/R), the mask selectivity, and the dimension of the bottom surface of the etching hole (bottom CD) for each of the wafers 103 and 104. The comparison result of FIG. 11 represents that the dimension of the bottom surface of an etching hole 107 formed in the wafer 104 is larger than the dimension of the bottom surface of an etching hole 106 formed in the wafer 103. That is, the comparison result of FIG. 11 represents that the etching method of the embodiment may form an etching hole having the bottom surface with a large dimension as the flow rate of chloroform ($CHCl_3$) added to the processing gas increases, and thus, may further improve the shape of the etching hole.

The comparison result of FIG. 11 represents that the etching rate of the wafer 104 is lower than the etching rate of the wafer 103. That is, the comparison result of FIG. 11 represents that the higher the flow rate of chloroform ($CHCl_3$) added to the processing gas, the lower the etching rate of the wafer. From this result, it is understood that the dimension of the etching hole formed in the wafer and the etching rate of the wafer have a trade-off relationship.

Figure 12:
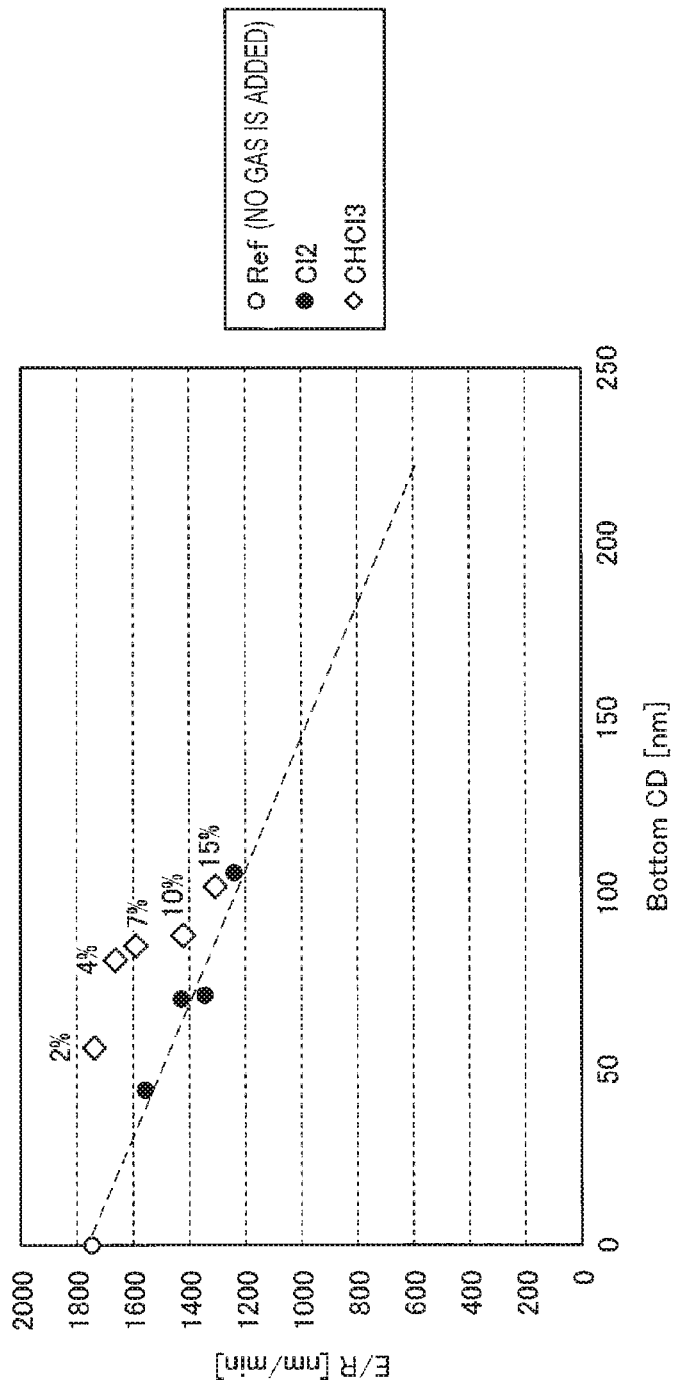
FIG. 12 is a view illustrating a relationship between a dimension of an etching hole and an etching rate.

FIG. 12 is a view illustrating an example of the relationship between the dimension of the etching hole and the etching rate. FIG. 12 represents results obtained from measuring the dimension of the etching hole and the etching rate when the wafer is etched while changing the flow rate of the gas added to the processing gas. The gas added to the processing gas is chlorine gas ($Cl_2$) or chloroform ($CHCl_3$). FIG. 12 represents the flow rate of added chloroform ($CHCl_3$) as a ratio to the total flow rate of the processing gas. FIG. 12 represents that when the processing gas to which chloroform ($CHCl_3$) is added is used, the degree of the decrease of the etching rate with respect to the increase of the dimension of the etching hole is low, as compared to a case where the processing gas to which chlorine gas ($Cl_2$) is added is used. However, when the flow rate of added chloroform ($CHCl_3$) exceeds 15%, the degree of the decrease of the etching rate with respect to the increase of the dimension of the etching hole increases, as in the case where the processing gas to which the chlorine gas ($Cl_2$) is added is used. Accordingly, the flow rate of chloroform ($CHCl_3$) added to the processing gas preferably falls within the range of 15% or lower, and more preferably, falls within the range of 7% or lower, with respect to the total flow rate of the processing gas.

In the etching method described above, an etching target containing silicon (Si) and nitrogen (N) such as a silicon nitride film is etched. However, an etching target containing silicon (Si) without containing nitrogen (N) may be etched. Examples of the etching target include a silicon oxide film, silicon carbide, a silicon-containing low dielectric constant film, and a film containing silicon such as single crystal silicon, polycrystalline silicon or amorphous silicon. At this time, the processing gas is further mixed with a compound containing nitrogen (N). Examples of the compound include ammonia ($NH_3$) and nitrogen trifluoride ($NF_3$). In this case as well, the salt AFS is produced as a by-product of the etching. Thus, the etching method may reduce the amount of the by-product attached to the surface of the etching target by decomposing the salt AFS, so that the etching target may be appropriately etched.

In the etching method described above, the wafer 27 is etched using the capacitively coupled plasma (CCP). However, other plasma may be used. Examples of the plasma include inductively coupled plasma (ICP) and plasma generated by using a radial line slot antenna. Examples of the plasma further include electron cyclotron resonance plasma (ECR) and helicon wave excitation plasma (HWP).

While plasma is used in the etching method of the embodiment described above, a liquid may be used. In this case as well, the etching method may reduce the amount of the salt AFS attached to the surface of the etching target, so that the etching target may be appropriately etched.

The present disclosure achieves effects in improving the shape of the etching hole, and further, improving the mask selectivity.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:
preparing a compound in a processing space in which an etching target is accommodated; and
etching the etching target with a mask film formed thereon, under an environment where the compound exists,
wherein the etching the etching target includes
etching the etching target under an environment where hydrogen (H) and fluorine (F) exist when the etching target contains silicon nitride (SiN), and
etching the etching target under an environment where nitrogen (N), hydrogen (H), and fluorine (F) exist when the etching target contains silicon (Si),
wherein the compound includes at least one halogen element selected from the group consisting of carbon (C), chlorine (Cl), bromine (Br), and iodine (I),
wherein a temperature of the etching target is higher than a temperature at which a reaction product is volatilized, and
wherein the compound includes chloroform ($CHCl_3$), and a flow rate of the chloroform ($CHCl_3$) falls within a range of 15% or lower with respect to a total flow rate of a processing gas that contains the compound.

2. The etching method according to claim 1, wherein the etching target contains silicone nitride (SiN) and silicon dioxide ($SiO_2$).

3. The etching method according to claim 1, wherein the temperature at which the reaction product is volatilized is a temperature represented by a vapor pressure curve of the reaction product.

4. The etching method according to claim 1, wherein the flow rate of the chloroform ($CHCl_3$) falls within a range of 7% or lower with respect to the total flow rate of the processing gas.

5. The etching method according to claim 1, wherein the etching target is etched in the processing space filled with the processing gas that contains the compound.

6. The etching method according to claim 5, wherein the etching target is disposed between a pair of electrodes,
a first radio-frequency power for generating plasma in the processing space and a second radio-frequency power for accelerating the plasma are applied to the pair of electrodes, and
the etching target is etched by the plasma.

7. The etching method according to claim 5, wherein the reaction product contains silicon, and the temperature of the etching target is equal to or lower than 100° C.

8. The etching method according to claim 7, wherein the reaction product is silicon halide.

9. The etching method according to claim 5, wherein the compound has a covalent bond between the carbon and the halogen element.

10. The etching method according to claim 9, wherein the compound is at least one halogen compound selected from the group consisting of a carbon halide containing at least one halogen element selected from the group consisting of chlorine (Cl), bromine (Br), and iodine (I), carbonyl halide containing at least one halogen element selected from the group consisting of chlorine (Cl), bromine (Br), and iodine (I), and halogenated benzene containing at least one halogen element selected from the group consisting of chlorine (Cl), bromine (Br), and iodine (I).

11. The etching method according to claim 10, wherein the etching target is disposed between a pair of electrodes,
a first radio-frequency power for generating plasma in the processing space and a second radio-frequency power for accelerating the plasma are applied to the pair of electrodes, and
the etching target is etched by the plasma.

12. The etching method according to claim 11, wherein the reaction product contains silicon, and the temperature of the etching target is equal to or lower than 100° C.

13. The etching method according to claim 12, wherein the reaction product is silicon halide.

14. The etching method according to claim 13, wherein the etching target contains silicone nitride (SiN) and silicon dioxide ($SiO_2$).

15. The etching method according to claim 14, wherein the etching target is formed by stacking a plurality of silicon nitride layers containing silicon nitride (SiN) and a plurality of silicon oxide film layers containing silicon dioxide ($SiO_2$).

16. An etching apparatus comprising:
a chamber having a processing space where an etching target is etched; and
a gas source configured to supply a processing gas containing a compound to the processing space,
wherein the compound includes at least one halogen element selected from the group consisting of chlorine (Cl), bromine (Br), and iodine (I),
wherein a temperature of the etching target is higher than a temperature at which a reaction product is volatilized, and
wherein the compound includes chloroform and a flow rate of the chloroform ($CHCl_3$) falls within a range of 15% or lower with respect to a total flow rate of the processing gas.

* * * * *